United States Patent [19]

Truong et al.

[11] Patent Number: 5,646,887
[45] Date of Patent: Jul. 8, 1997

[54] SENSE AMPLIFIER WITH PRE-CHARGE CIRCUIT AND LOW-VOLTAGE OPERATION MODE

[75] Inventors: Phat C. Truong, Houston; Tim M. Coffman, Sugar Land, both of Tex.

[73] Assignee: Texas Instruments Incorporated

[21] Appl. No.: 559,126

[22] Filed: Nov. 20, 1995

[51] Int. Cl.$^6$ ................................................ G11C 11/34
[52] U.S. Cl. .................... 365/185.21; 365/205; 365/207; 327/51
[58] Field of Search .............................. 327/51; 365/203, 365/205, 207, 210, 185.21

[56] References Cited

U.S. PATENT DOCUMENTS 5,297,079  3/1994  Ha .......................................... 365/210

*Primary Examiner*—David C. Nelms
*Assistant Examiner*—F. Niranjan
*Attorney, Agent, or Firm*—Theodore D. Lindgren; Leo N. Heiting; Richard L. Donaldson

[57] ABSTRACT

Low-voltage-correcting bias circuitry for a sense amplifier includes first, second and third N-channel transistors. The channel of the first transistor couples a current mirror to the input terminal of the amplifier and the gate of the second transistor, the channel of the second transistor couples the gate of the first transistor to a reference terminal. The channel of the third transistor couples the supply voltage to the gate of the first transistor. The gate of the third transistor is coupled to a reference voltage. A P-channel transistor has a channel coupling the supply voltage to the gate of the first transistor. The gate of the P-channel transistor is coupled to a low-voltage-sensing signal. Pre-charge circuitry includes a nonvolatile memory cell and fourth, fifth and sixth N-channel transistors. The channel of the fourth transistor is in series with the channel of the memory cell. The channel of the fifth transistor couples the channel of the memory cell to the input of the sense amplifier. The gates of the fourth and fifth transistors are coupled to a pre-charge operation control signal. The channel of the sixth transistor couples the supply voltage to the channel of the fourth transistor and the gate of the sixth transistor is coupled to the gate of the first transistor.

6 Claims, 1 Drawing Sheet 5,646,887

SENSE AMPLIFIER WITH PRE-CHARGE CIRCUIT AND LOW-VOLTAGE OPERATION MODE

BACKGROUND OF THE INVENTION

This invention relates to Flash Electrically-Programmable Erasable Read-Only-Memories (Flash EPROMs). In particular, this invention relates to a sense amplifier for use in Flash EPROMs designed to improve the speed of operation when used with either a 3 V or a 5 V supply.

Flash EPROMs are generally described in U.S. Pat. application Ser. No. 08/315,526 filed Sep. 30, 1994, entitled "FLASH EPROM CONTROL WITH EMBEDDED PULSE TIMER AND WITH BUILT-IN SIGNATURE ANALYSIS", also assigned to Texas Instruments Incorporated. That Patent Application is hereby incorporated herein.

An example sense amplifier is described in U.S. Pat. No. 5,056,063 issued Oct. 18, 1991 and assigned to Texas Instruments Incorporated. A sense amplifier bias circuit is described in U.S. Pat. No. 5,132,933 issued Jul. 21, 1992, also assigned to Texas Instruments Incorporated.

In a high-density Flash EPROM designed for use with either a 3 V or a 5 V supply voltage, a prior-art sense amplifier designed for use with a 5 V supply does not operate correctly when the device operates using a 3 V supply. There is a need for an improved sense amplifier that allows a Flash EPROM to operate in the lower voltage range and that improves speed of operation in both the approximately 5 V range and the approximately 3 V range of supply voltages.

SUMMARY OF THE INVENTION

The sense amplifier circuit of this invention allows a Flash EPROM to operate in both the 3 V and 5 V ranges of supply voltage, at the same time improving speed of operation in both ranges. The improved design pre-charges the bitlines to an intermediate level between a "ZERO" and a "ONE" to improve speed in reading a "ONE" in both the 3 V and the 5 V ranges supply voltage. In addition, the sense amplifier defaults to a "ZERO" output to avoid slow transistor pull-up time when reading a "ZERO".

The sense amplifier with pre-charge circuitry and low-voltage-operation option includes a conventional sense amplifier with one P-channel transistor and one N-channel transistor for power-down, with six N-channel transistors for the bias circuit, and with two floating-gate reference memory cells for comparison. In addition to the elements of the prior-art sense amplifier, the sense amplifier of this invention includes pre-charge circuitry comprising two N-channel transistors to default outputs and three N-channel transistors and a floating-gate memory cell to pre-charge the bitline. The sense amplifier also includes two P-channel transistors and one capacitor to allow the sense amplifier to operate in the lower voltage range.

DETAILED DESCRIPTION OF THE INVENTION

Figure 1:
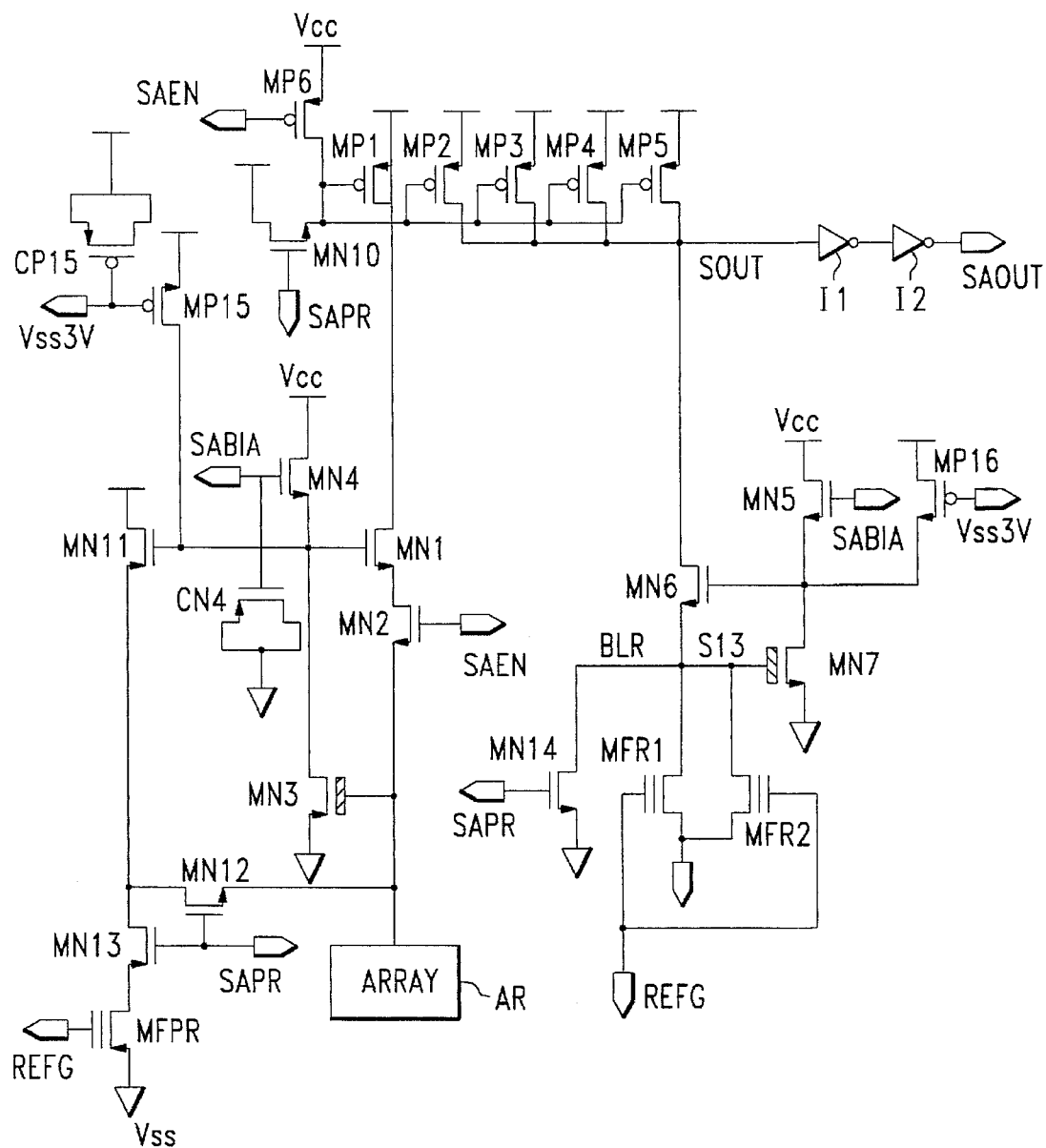
FIG. 1 is a schematic diagram of the sense amplifier of this invention.

Referring to FIG. 1, operation of the sense amplifier circuit SA illustrated therein is described. During power-down of the Flash EPROM, enabling terminal SAEN is at a low level, transistor MP6 is ON and transistor MN2 is OFF. Under these conditions, all current in the sense amplifier SA is cut off and the output SAOUT is at low level.

Terminal SABIA is coupled to reference voltage, normally supply voltage $V_{CC}$. Terminal VSS3V is coupled to a reference voltage, normally $V_{ss}$. Terminal SAPR is connected to a signal that at high level indicates pre-charge operation.

When terminal SAEN is at a high level, the sense amplifier SA is in the active mode. In the active mode, the sense amplifier SA senses current from the nonvolatile flash memory array AR through bitline terminal BLZ. Current from the flash memory array AR through transistor MP1 is then mirrored four times (increased by a factor of four) by identical transistors MP2, MP3, MP4 and MP5. The current output of transistors MP2, MP3, MP4 and MP5 is then compared with the current in two reference memory cells MFR1 and MFR2 to determine the state at read output terminal SOUT. If the current at bitline terminal BLZ from the array AR is less than one-half of the current of the reference memory cells MFR1 and MFR2, then the total current in transistors MP2, MP3, MP4 and MP5 is less than twice the current in the two reference memory cells and the read output at terminal SOUT is low. That is, the sense amplifier SA indicates a reading of "ZERO" at the read output terminal SAOUT. If the current in the array is more than one-half of the current in the reference cells MFR1 and MFR2, the total current in transistors MP2, MP3, MP3 and MP4 is more than the current in the two reference cells, read output terminal SOUT is at high level, and the sense amplifier SA indicates a reading of "ONE" at the read output terminal SAOUT.

Transistors MN1, MN3 and MN4 maintain bitline terminal BLZ at about one N-channel-threshold-voltage $V_{TN}$ level, and transistors MN5, MN6 and MN7 maintain terminal BLR at about the N-channel-threshold-voltage $V_{TN}$ level when the output reading is a "ONE". These transistors MN1, MN3, MN4, MN5, MN6 and MN7 only operate correctly if the supply voltage $V_{CC}$ is higher than three times the N-channel-threshold-voltage $V_{TN}$ level.

To overcome this problem, transistors MP15 and MP16 are turned ON if a low voltage supply $V_{CC}$ is detected. When a low voltage supply $V_{CC}$ is detected, terminal VSS3V is at a low level, which allows the sense amplifier SA to operate with the lower voltage supply $V_{CC}$ (twice the N-channel threshold voltage $V_{TN}$).

Capacitor CP15 is added between supply voltage $V_{CC}$ and the VSS3V terminal to lessen noise effects from the supply voltage $V_{CC}$.

Transistors MN10, MN11, MN12, MN13 and MN14 and pre-charged memory cell MFPR are added to pre-charge the bitline terminal BLZ and the default output terminal SAOUT to a low level during the pre-charge cycle.

When a transition in addresses occurs, a pre-charge pulse at terminal SAPR is generated. During the pre-charging time period, transistors MN10 and MN14 are ON, which maintains terminal SAOUT at a low level and terminal SN at a level of $V_{CC}-V_{TN}$. Transistors MN12 and MN13 are ON, which rapidly increases the voltage at bitline terminal BLZ to the bias level through transistor MN11. Bitline terminal BLZ is also connected to a memory cell transistor MFPR through transistors MN12 and MN13, which maintains terminal BLZ at an intermediate voltage level between "ZERO" and "ONE". Because the sense amplifier SA is pre-charged to zero, the speed of reading a "ZERO" is no longer dependent on the slow pull-up of P-channel transistor MP1. The speed of reading a "ONE" is also improved by the fact that bitline terminal BLZ is pre-charged to an intermediate voltage level.

In summary, the sense amplifier SA of this invention defaults to "ZERO" to avoid slow pull-up of the transistor MP1 when reading a "ZERO". The bitlines are pre-charged to an intermediate level between "ZERO" and "ONE" to improve speed when reading a "ONE". The sense amplifier SA operates at both higher and lower supply voltages.

The sense amplifier SA with pre-charge circuitry and low-voltage-operation option includes:

a) a conventional sense amplifier
   One P-channel transistor and one N-channel transistor for power-down
   Six N-channel transistors for the bias circuit
   Two floating-gate reference memory cells for comparison.

b) pre-charge circuitry
   Two N-channel transistors to default outputs
   Three N-channel transistors and a floating-gate memory cell to pre-charge the bitline.

c) two P-channel transistors and one capacitor to allow the sense amplifier to operate in the lower voltage range.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. Low voltage correcting bias circuitry for use in a sense amplifier, said sense amplifier having an input terminal connected to the source-drain path of at least one nonvolatile memory cell, said bias circuitry comprising:

a first N-channel transistor having a gate and a source-drain path, one end of said source-drain path of said first N-channel transistor coupled to said input terminal of said sense amplifier, the other end of said first N-channel transistor coupled to current mirror;

a second N-channel transistor having a gate and a source-drain path, said gate of said second transistor coupled to said input terminal of said sense amplifier, one end of said source-drain path of said second transistor coupled to a reference terminal, the other end of said source-drain path of said second transistor coupled to said gate of said first transistor;

a third N-channel transistor having a gate and a source-drain path, said gate of said third transistor coupled to first reference voltage, one end of said source-drain path of said third transistor coupled to said gate of said first transistor, the other end of said source-drain path of said third transistor coupled to a supply voltage; and a P-channel transistor having a gate and a source-drain path, said gate of said P-channel transistor coupled to a low-voltage signal terminal, one end of said source-drain path of said P-channel transistor coupled to said supply voltage, the other end of said source-drain path of said P-channel transistor coupled to said gate of said first transistor.

2. The bias circuitry of claim 1, further including a capacitor connected between said gate of said P-channel transistor and said supply voltage.

3. The bias circuitry of claim 1, further including a fourth N-channel transistor having a gate and a source-drain path, said gate of said fourth N-channel transistor coupled to an enabling signal and said source-drain path of said fourth N-channel transistor coupling said other end of said source-drain path of said first N-channel transistor to said gate of said second transistor.

4. The bias circuitry of claim 1, further including a capacitor coupled between said gate of said third N-channel transistor and said reference terminal.

5. Pre-charge circuitry for use in a sense amplifier, said sense amplifier having an input terminal connected to the source-drain path of at least a first memory cell, said pre-charge circuitry comprising:

a second memory cell having a source-drain path, one end of said source drain path of said second memory cell coupled to a reference terminal;

a first N-channel transistor having a gate and a source-drain path, said source-drain path of said first N-channel transistor coupled to pre-charge operation indicating signal, one end of said source-drain path of said first N-channel transistor coupled to the other end of said source-drain path of said second memory cell;

a second N-channel transistor having a gate and a source-drain path, said gate of said second N-channel transistor coupled to said gate of said first N-channel transistor, one end of said source drain path of said first N-channel transistor coupled to said other end of said source-drain path of said first N-channel transistor, the other end of said source-drain path of said second N-channel transistor coupled to said input of said sense amplifier;

a third N-channel transistor having a gate and a source-drain path, one end of said source-drain path of said third N-channel transistor coupled to said other end of said source-drain path of said first N-channel transistor, the other end of said source-drain path of said third N-channel transistor coupled to said supply voltage; and a P-channel transistor having a gate and a source-drain path, said gate of said P-channel transistor coupled to a low-voltage signal terminal, one end of said source-drain path of said P-channel transistor coupled to said supply voltage, the other end of said source-drain path of said P-channel transistor coupled to said gate of said third transistor.

6. The pre-charge circuitry of claim 5, further including a capacitor connected between said gate of said P-channel transistor and said supply voltage.

* * * * *